(12) United States Patent
Guillot et al.

(10) Patent No.: US 10,375,849 B2
(45) Date of Patent: Aug. 6, 2019

(54) BACKPLANE ELECTRONIC BOARD AND ASSOCIATED ELECTRONIC CONTROL UNIT

(71) Applicant: SAFRAN ELECTRONICS & DEFENSE, Boulogne-Billancourt (FR)

(72) Inventors: Francois Guillot, Boulogne-Billancourt (FR); Pascal Spoor, Boulogne-Billancourt (FR); Patrice Chetanneau, Boulogne-Billancourt (FR)

(73) Assignee: SAFRAN ELECTRONICS & DEFENSE, Boulogne-Billancourt (FR)

( * ) Notice: Subject to any disclaimer, the term of this patent is extended or adjusted under 35 U.S.C. 154(b) by 0 days.

(21) Appl. No.: 15/559,975

(22) PCT Filed: Mar. 23, 2016

(86) PCT No.: PCT/EP2016/056462
§ 371 (c)(1),
(2) Date: Sep. 20, 2017

(87) PCT Pub. No.: WO2016/151053
PCT Pub. Date: Sep. 29, 2016

(65) Prior Publication Data
US 2018/0110149 A1 Apr. 19, 2018

(30) Foreign Application Priority Data
Mar. 23, 2015 (FR) ..................................... 15 52398

(51) Int. Cl.
*H05K 7/14* (2006.01)
*H05K 1/11* (2006.01)
(Continued)

(52) U.S. Cl.
CPC ........... *H05K 7/1439* (2013.01); *G06F 1/184* (2013.01); *H01R 12/7064* (2013.01);
(Continued)

(58) Field of Classification Search
CPC .................... H05K 1/111; H05K 1/115; H05K 1/141–144; H05K 7/14; H05K 7/1439;
(Continued)

(56) References Cited

U.S. PATENT DOCUMENTS

| | | | | |
|---|---|---|---|---|
| 5,397,861 A | * | 3/1995 | Urquhart, II | ......... H05K 1/0219 174/250 |
| 8,841,560 B1 | * | 9/2014 | Roberts | .................. H05K 1/141 174/261 |

(Continued)

OTHER PUBLICATIONS

French Search Report, dated Feb. 12, 2016, French Application No. 1552398.
(Continued)

*Primary Examiner* — Tuan T Dinh
(74) *Attorney, Agent, or Firm* — Womble Bond Dickinson (US) LLP

(57) ABSTRACT

The present invention concerns a backplane electronic board (20) having on inner face (142) suitable for being connected to electronic board connectors (12) and an outer face (143) suitable for being connected to an outer connector (15), the backplane board (20) being characterized in that it has blind holes opening on the inner face (142) of same, and holes opening on the outer face (143) of same, the holes being suitable for receiving press-fit connection elements and forming therewith an electrical connection point.

10 Claims, 11 Drawing Sheets

(51) Int. Cl.
*H05K 3/42* (2006.01)
*G06F 1/18* (2006.01)
*H01R 12/70* (2011.01)
*H01R 12/71* (2011.01)
*H05K 3/00* (2006.01)
*H05K 3/46* (2006.01)

(52) U.S. Cl.
CPC ............ *H01R 12/716* (2013.01); *H05K 1/111* (2013.01); *H05K 1/115* (2013.01); *H05K 3/0011* (2013.01); *H05K 3/421* (2013.01); *H05K 3/4644* (2013.01); *H05K 7/1412* (2013.01); *H05K 7/1445* (2013.01); *H05K 7/1452* (2013.01); *H05K 7/1459* (2013.01); *H05K 3/0094* (2013.01); *H05K 2201/0104* (2013.01); *H05K 2201/09509* (2013.01); *H05K 2201/09545* (2013.01); *H05K 2201/10189* (2013.01); *H05K 2201/10295* (2013.01)

(58) Field of Classification Search
CPC ......... H05K 7/1452; G06F 1/11; G06F 1/184; G06F 1/115; G06F 1/144

USPC ................ 361/788, 803, 792–795, 775–778; 710/300–305
See application file for complete search history.

(56) References Cited

U.S. PATENT DOCUMENTS

| | | |
|---|---|---|
| 2003/0179532 A1 | 9/2003 | Goergen |
| 2005/0109532 A1 | 5/2005 | Hermkens et al. |
| 2006/0232949 A1* | 10/2006 | Osaka .................. H05K 1/0236 361/788 |
| 2008/0025007 A1* | 1/2008 | Ao ......................... H05K 1/115 361/760 |
| 2008/0257594 A1 | 10/2008 | Engblom et al. |
| 2014/0353018 A1 | 12/2014 | Soeda et al. |

OTHER PUBLICATIONS

International Search Report and Written Opinion with English Language Translation, dated Jun. 23, 2016, Application No. PCT/EP2016/056462.

* cited by examiner

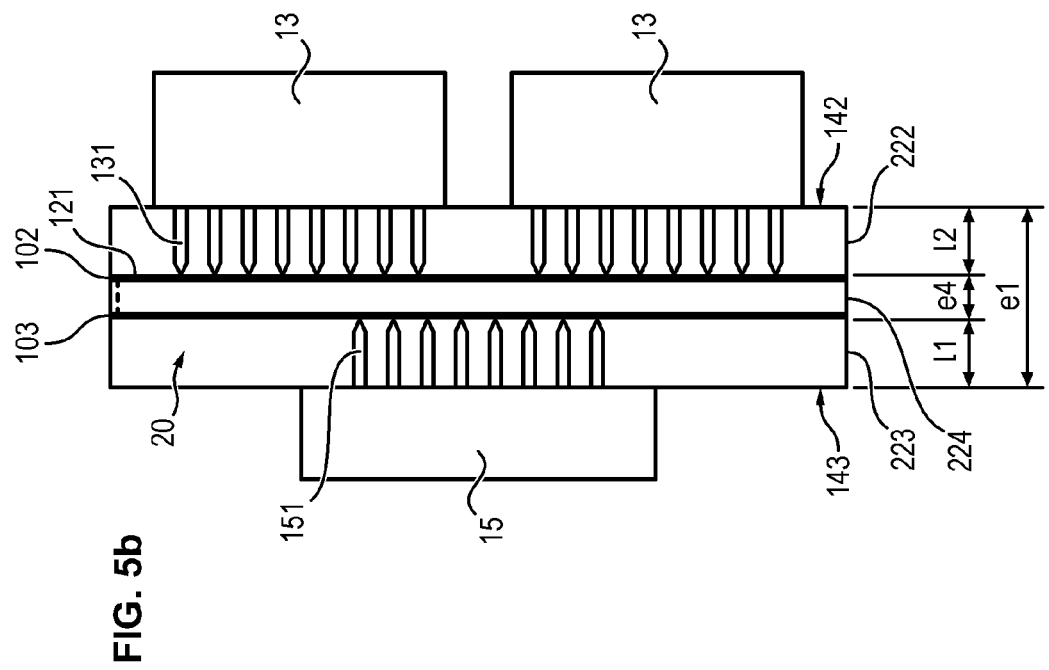
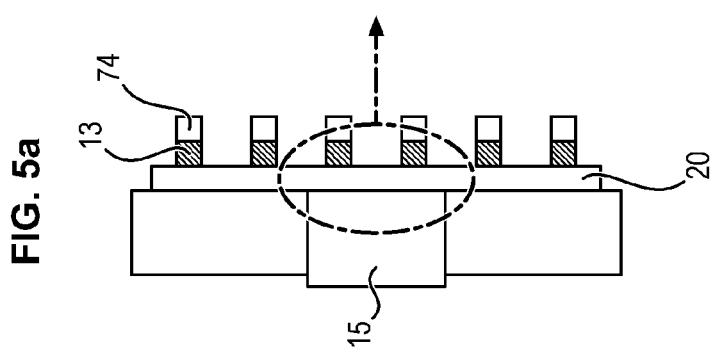

FIG. 15
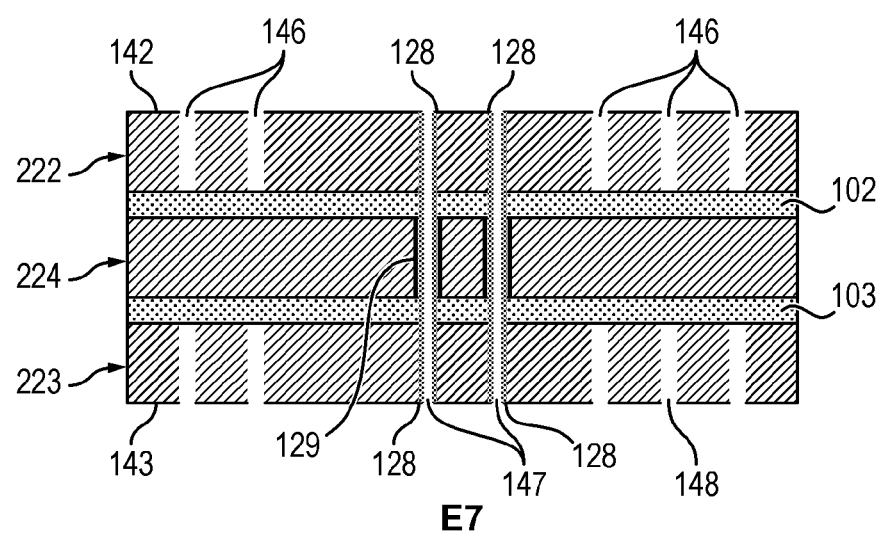
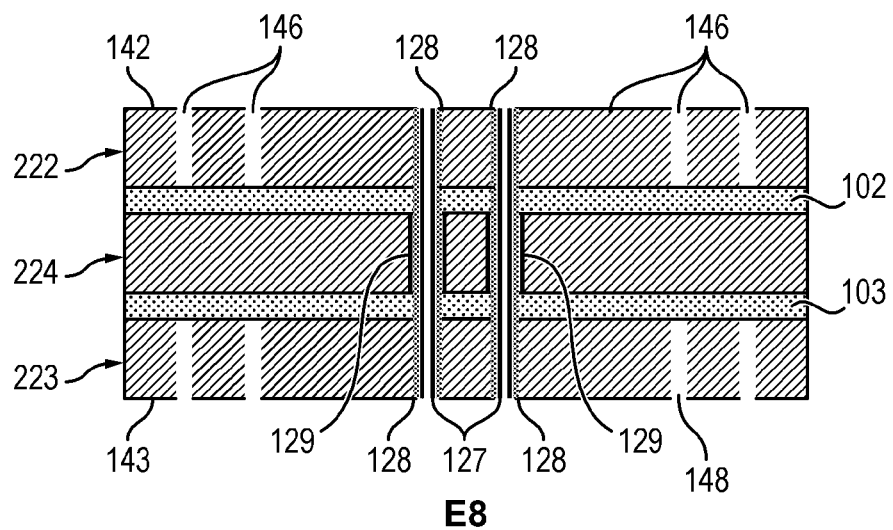

BACKPLANE ELECTRONIC BOARD AND ASSOCIATED ELECTRONIC CONTROL UNIT

FIELD OF THE INVENTION

The field of the invention is that of electronic computers and in particular computers of aircraft systems embedded onboard.

STATE OF THE ART

In modern aircrafts, it is known how to connect between them the modules for piloting and/or controlling functional members of the aircraft through one or several main buses of the aircraft. These buses are currently buses specific to the field of aviation, and notably buses using distributed serial bus protocols of the ARINC 429 types or other ones. Thus, as an example, for handling mobile elements of the landing gear of an aircraft, several piloting and/or control modules are applied, the latter being each connected to the main buses of the aircraft.

Each piloting module includes a computer 1 applying a program adapted to ensure the piloting function to which it is dedicated, as well as a communication interface adapted to the main bus protocol allowing exchange of data between the computer and the main buses of the aircraft.

FIG. 1 shows the simplified diagram of an electronic computer 1. The latter comprises a mechanical frame 11, one or several electronic boards 12 and a so called backplane board 20 or 'backplane'.

Each electronic board 12 is mechanically maintained in the frame 11 with rails and connected to the 'backplane' board 20. The 'backplane' board 20 includes board connectors 13 adapted so as to be connected to an additional connector 74 borne by the electronic board 12.

The backplane board 20 includes, for each piloting module, an external connector 15 adapted for cooperating with an additional connector borne by the associated module.

As illustrated in FIG. 1, it is known how to connect the external connector 15 to the backplane board 20 through wires 71 wound on square pins 72 of the components, according to a so called 'Wrapping' method.

The wrapping technique has many drawbacks and notably an excessive price cost, the obsolescence of the components and of the skills and poor performances of electromagnetic compatibility.

Another drawback of wrapping is the absence of impedance matching and the noise may generate reflection phenomena at high frequencies and electronic failures on the critical signals.

Another drawback of wrapping is that it requires a cabling area with a consequent width which is a penalty to the compactness of the computer 1.

As illustrated in FIG. 2, it was proposed to use a ribbon cable 16 which is a flat electric strip (flexible printed circuit as a ribbon), consisting of copper wires adhesively bonded to each other, provided with a connector at each of its ends in order to connect the external connector 15 and the backplane board 20.

As illustrated in FIG. 3, it was also proposed to connect the external connector 15 to a connection printed circuit 19 connected to the backplane board 20 through a flexible printed circuit 18 and through connectors of additional interconnections 17.

All these solutions are complex, expensive and cumbersome.

Moreover electronic boards, such as the one described in document US 2005/109532 (D1) are also known, including two printed circuits adhesively bonded to each other through a resin layer and having a series of first blind holes opening onto the first face of the electronic board and a series of second blind holes opening onto the second face of the electronic board allowing direct reception of connectors using a technology of force-fitted pins in metallized holes and being directly mounted on either side of each face of the printed circuit board (PCB).

Now, in such electronic boards, the resin risks moving upwards in the blind holes during the assembly of the printed circuits, which has the consequence that the connection elements in the form of pins can no longer be inserted into the blind holes.

DISCUSSION OF THE INVENTION

The invention gives the possibility of overcoming at least one of the aforementioned drawbacks by proposing a backplane electronic board having an internal face adapted for being connected to connectors of electronic boards and an external face adapted for being connected to an external connector, the backplane board being characterized in that it has a first leak-proof membrane, a series of first blind holes opening on the one hand on the internal face of the backplane electronic board and on the other hand on the first leak-proof membrane, and a second leak-proof membrane, a series of second blind holes opening on the one hand on the external face of the backplane electronic board and on the other hand on the leak-proof second membrane, the first and the second blind holes being adapted for receiving force-insertion connection elements and forming with them an electric connection point.

The first and second leak-proof membranes prevent the moving up of the resin in the blind holes during the manufacturing of the backplane board.

The invention gives the possibility of suppressing the entirety of the wire cablings and ribbon cables in the rear block.

The invention further gives the possibility of suppressing all the components directly mounted on the mechanical frame as well as all the additional boards (other than the electronic boards).

The invention gives the possibility of reducing the connection space between the external connector and the electronic boards. The depth of the computers being set in the avionics, this also practically gives the possibility of increasing the length of the electronic boards.

The invention also gives the possibility of allocating filtering functions on the main printed circuit of the bottom block notably which allows the suppression of the additional boards and filters.

The invention is advantageously completed with the following features, taken individually or in any of their technically possible combinations.

The blind holes are made in the backplane electronic board so as to make between them a shielding area.

The backplane board further has through-holes which cross the backplane board right through.

The backplane board includes a main printed circuit including two multilayer printed circuits, two insulating layers, and a double face printed circuit positioned in the middle of the two insulating layers, themselves positioned in the middle of the two multilayer printed circuits, the double face printed circuit forming the shielding area.

The backplane board includes a layer of insulating polymer between the multilayer printed circuit and the insulating layer.

The backplane board includes a main printed circuit and an interface platelet attached on the main printed circuit, the interface platelet having holes adapted for receiving force-insertion connection elements and forming with them an electric connection point.

The interface platelet includes a matrix of beads adapted for being welded on the main printed circuit.

The first blind holes are advantageously covered with an external layer of insulating polymer intended to be pierced with force-insertion connection elements.

The invention also proposes an electronic computer including a mechanical frame, a backplane board having an internal face and an external face, one or several electronic board connectors connected to the backplane board on its internal face, and at least one external connector connected to the backplane board on its external face, the electronic computer being characterized in that the connectors of electronic boards and the external connector have force-insertion connection elements, and in that the backplane electronic board has a series of first blind holes opening onto its internal face adapted for receiving the force-insertion connection elements of the connectors of electronic boards so as to form with them an electric junction; and a series of second holes opening onto its external face adapted for receiving the force-insertion connection elements of the external connector so as to form between them an electric junction.

DESCRIPTION OF THE FIGURES

Other objects, features and advantages will emerge from the detailed description which follows with reference to the drawings given as an illustration and not as a limitation among which:

FIG. 5a represents an electronic computer according to the invention;

FIG. 5b is an enlarged view of a 'backplane' board of FIG. 5;

FIGS. 14 and 15 illustrate the method for manufacturing blind holes according to the invention.

DETAILED DESCRIPTION OF THE INVENTION

Figure 1:
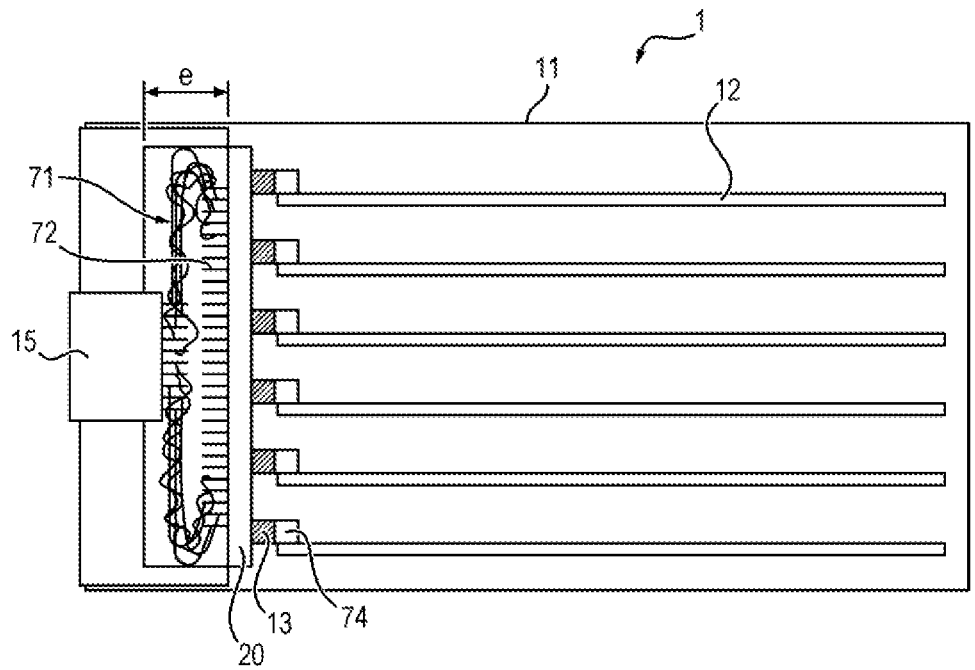
FIGS. 1 to 3 represent electronic computers of the prior art.
Figure 2:
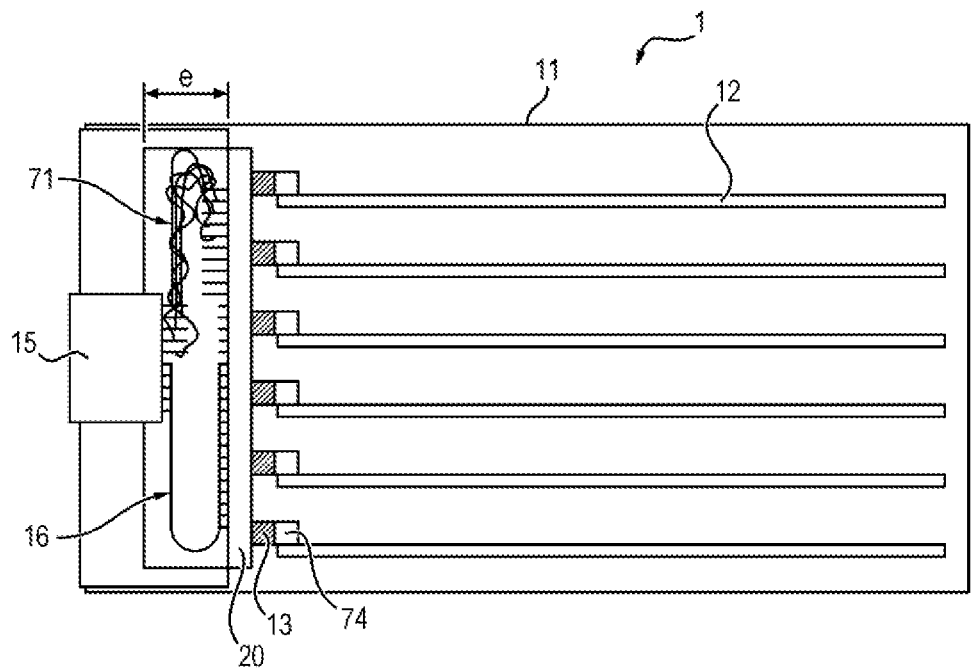
Figure 3:
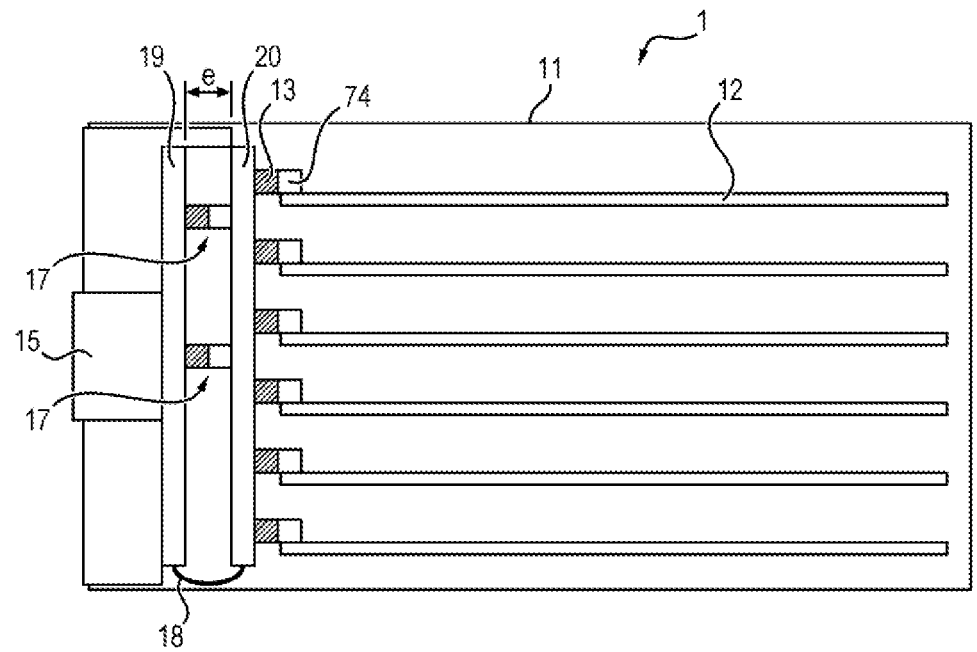
Figure 4:
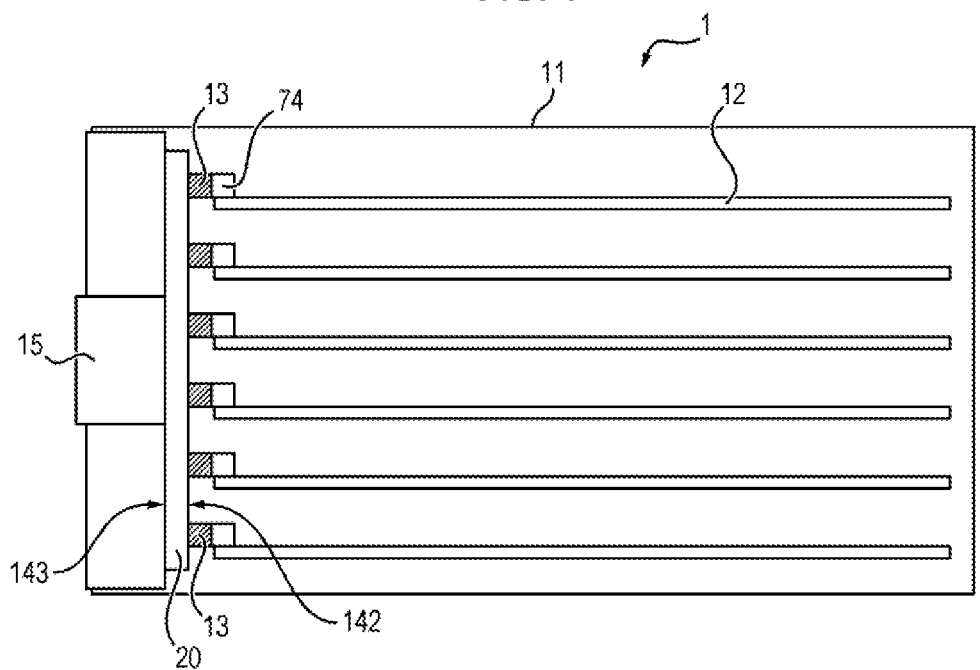
FIG. 4 is a simplified diagram of an electronic computer according to the invention.

With reference to FIG. 4, an electronic computer 1 includes a mechanical frame 11, one or several electronic boards 12 mechanically maintained in the frame 11 and a so called 'backplane' electronic board 20 or 'backplane' which forms the bottom of the mechanical frame 11.

Mechanical Frame 11

With reference to FIG. 4, the mechanical frame 11 is typically a rectangular parallelepiped including two open parallel faces' a first open face adapted for introducing electronic boards 12 and a second open face adapted so as to be closed by the 'backplane' board 20. The electronic boards 12 are mechanically maintained in the frame 11 for example with rails.

Figure 7:
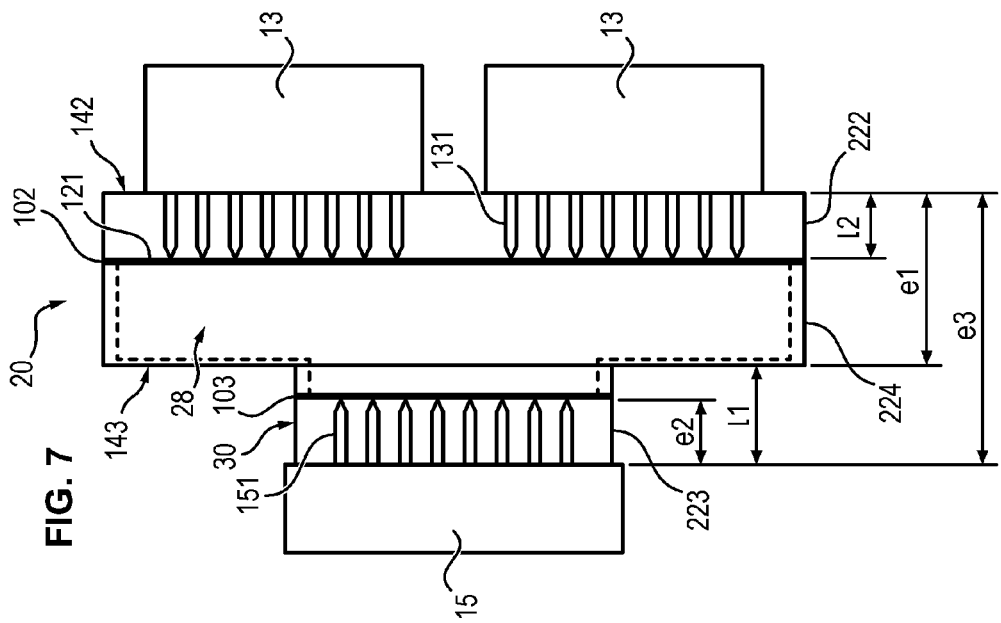
FIGS. 6 and 7 are simplified diagrams of exemplary backplane boards according to the invention.
Figure 6:
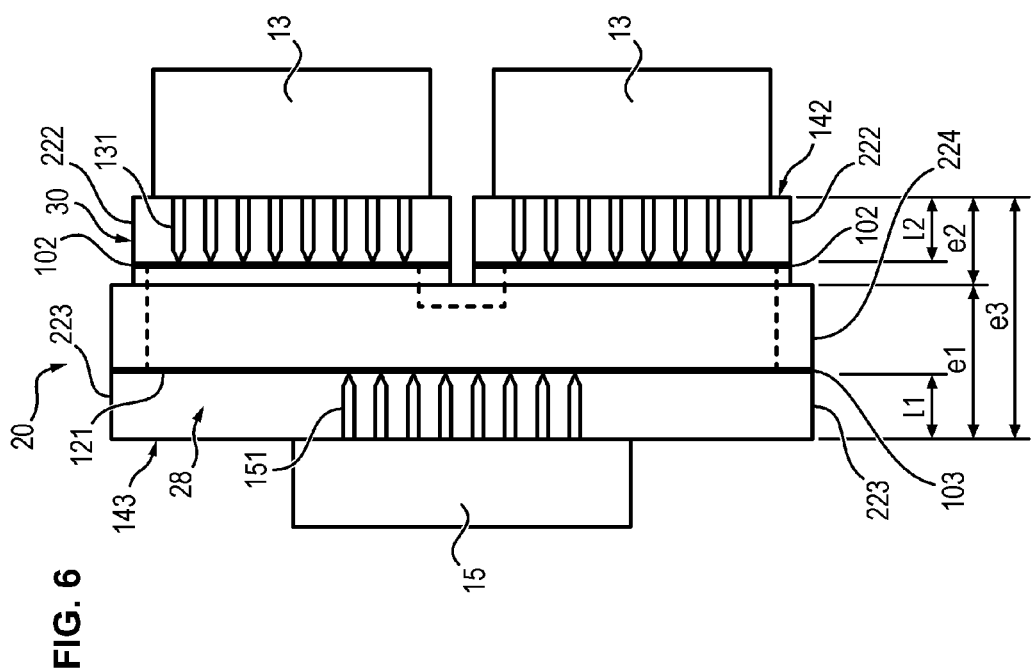
Figure 10:
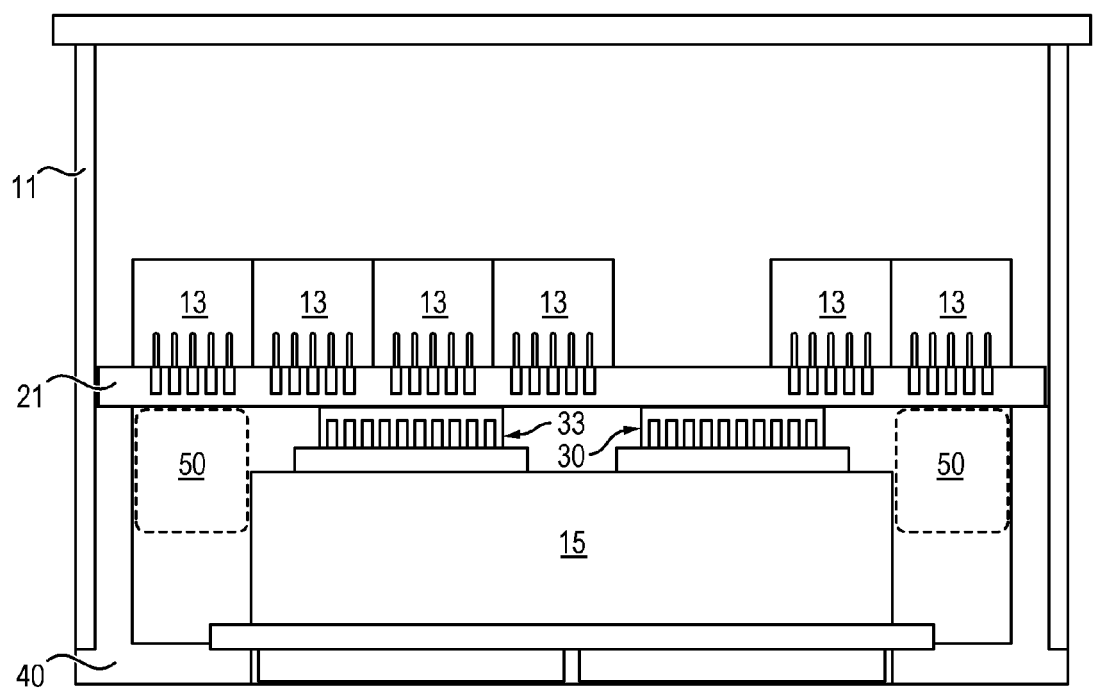
FIG. 10 represents a computer in the plane transverse to the plane of the backplane board.

With reference to FIGS. 6 and 7, the backplane board 20 (FIG. 4) is formed with a main circuit 28 for which the dimensions correspond to the open face of the bottom block. The backplane board 20 is attached through its periphery on the flanks of the mechanical frame 11. With reference to FIG. 10, the computer may also include a support 40 for a backplane board attached to the mechanical frame 11 on which is attached the backplane board 20.

Backplane Board 20

The backplane board 20 is adapted so as to be attached on the mechanical frame 11 so as to close the second open face of the frame.

With reference to FIG. 7, the backplane board 20 includes at least one main printed circuit 28 on which tracks form a set of interconnections.

With reference to FIG. 5b, the backplane board 20 has an internal face 142 adapted for receiving the board connectors 13 and an external face 143 adapted for receiving the external connector 15.

The backplane board 20 includes:
- a first printed circuit 222 having a first face and a second face intended to form the internal face 142 of the backplane electronic board 20;
- a second printed circuit 223 having a first face and a second face intended to form the external face 143 of the backplane electronic board 20 and;
- a third printed circuit 224.

The first face of the first printed circuit 222 is attached onto one of the faces of the third printed circuit 224, and the first face of the second printed circuit 223 is attached onto the other face of the third printed circuit 224, with a resin, typically an epoxy resin.

Electronic Board 12

Each electronic board 12 comprises a printed circuit and electronic components.

Each electronic board 12 is connected by means of one or several board connectors 13 onto the internal face 142 of the electronic backplane board 20.

The board connectors 13 have force-insertion connection elements 131 which are typically connection elements in the form of pins. These connection elements in the form of pins have typically a length l2 comprised between 1 and 2.5 mm.

External Connector of the ARINC 600 15 Type

One or several piloting modules are connected to the backplane board 20 so as to communicate with the bus of the latter according to a serial bus protocol for example distributed of the ARINC 429 types.

Each piloting module is formed with one or several boards adapted so as to be connected on the external face 143 of the backplane board 20 through an external connector 15 for example a connector of the ARINC 600 type.

Figure 9:
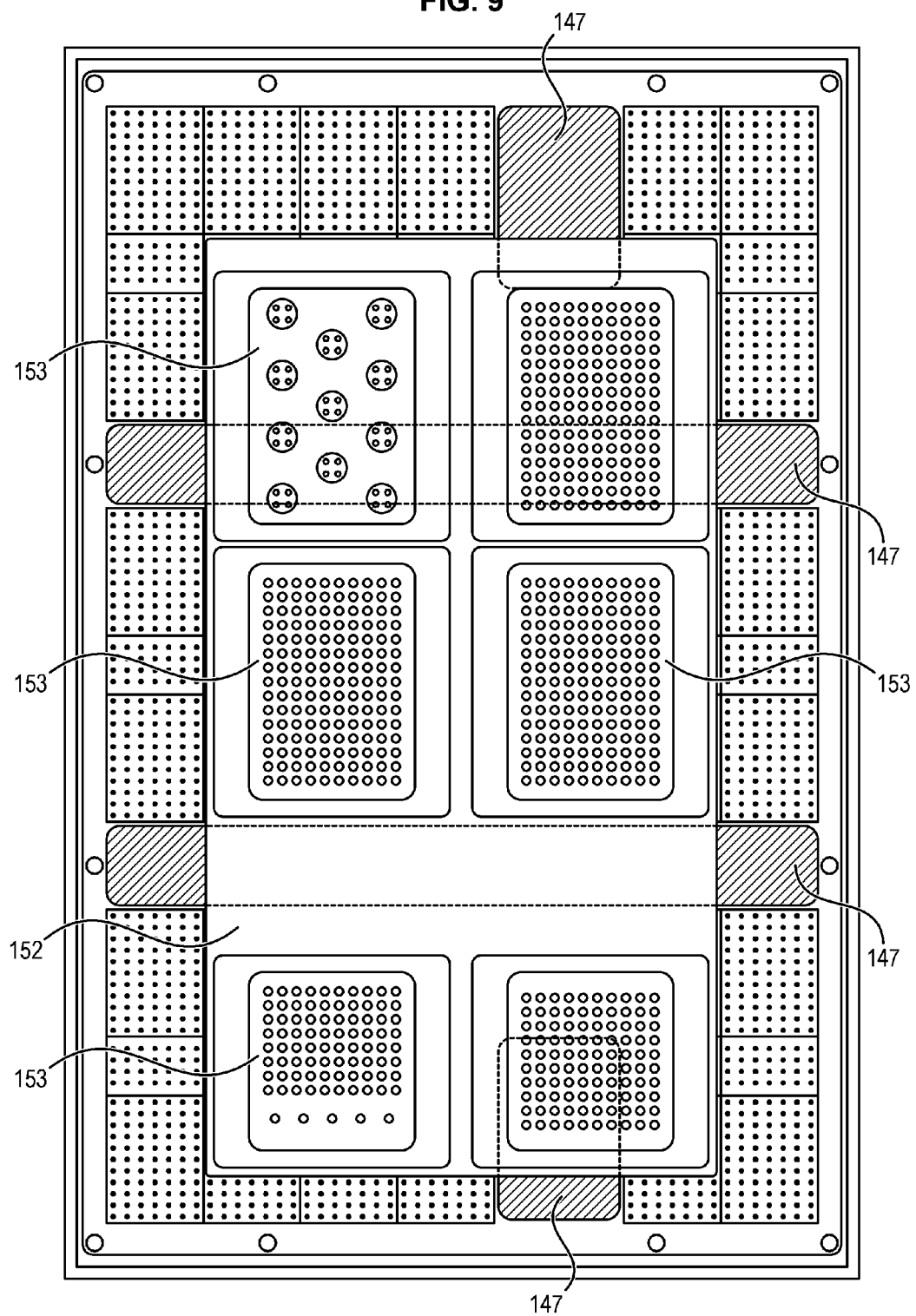
FIG. 9 represents a computer in the plane of the backplane board.

The external connector 15 includes a mating space 152 (FIG. 9) including connector imprints 153 having force-insertion connection elements 151 which are typically connection elements in the form of pins. These connection elements in the form of pins 151 (FIG. 5b) have typically a length l1 comprised between 1 and 2.5 mm.

Blind Holes

Figure 8:
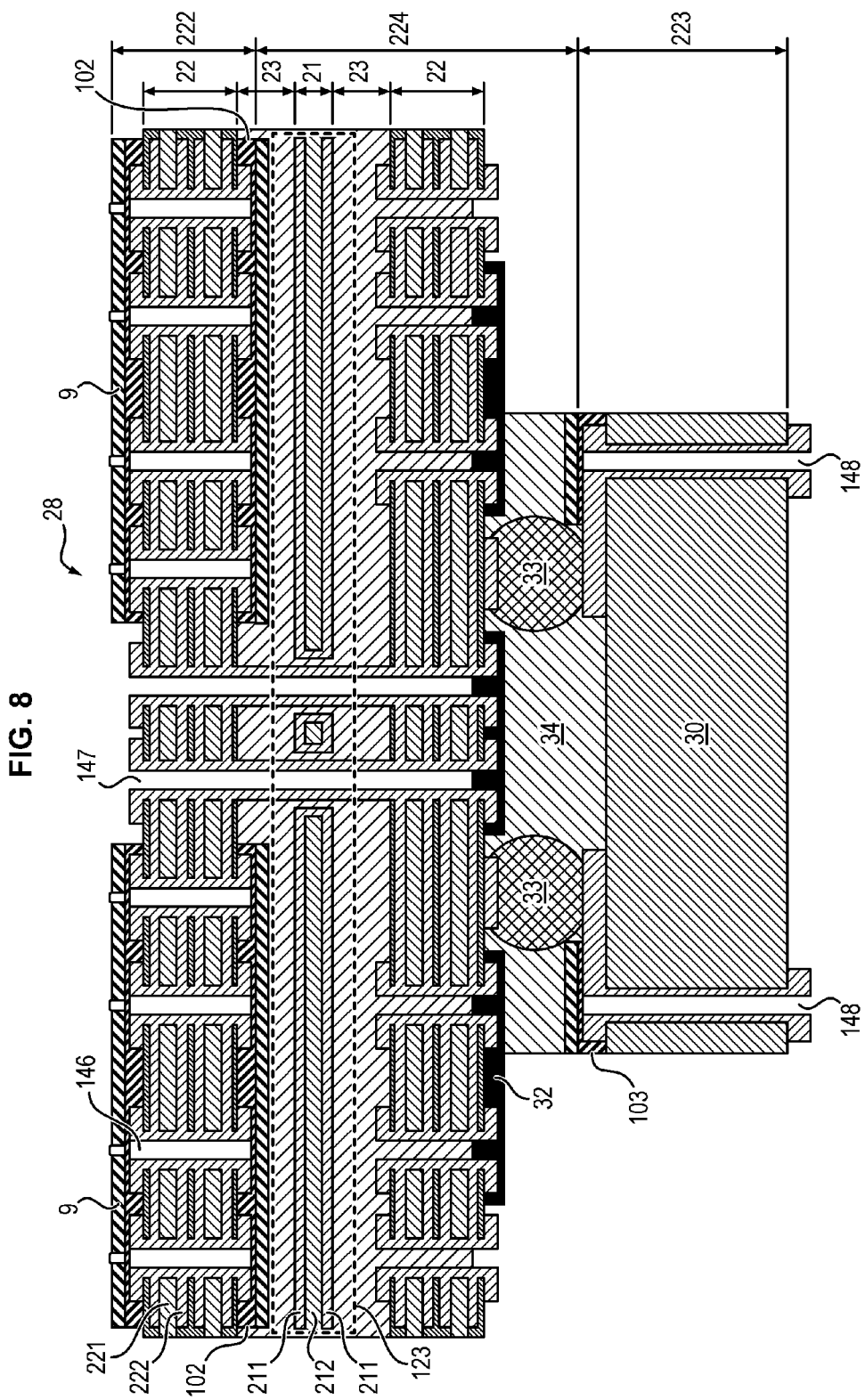
FIG. 8 is a detailed diagram of the backplane board of FIG. 7.

With reference to FIGS. 5b and 8, the backplane board 20 has first blind holes 146 opening onto its internal face 142 and adapted for receiving force-insertion connection elements borne by the board connectors 13, and second holes 148 opening onto its external face 143 and adapted for receiving force-insertion connection elements borne by the external connectors 15.

The second holes 148 are initially through-holes, but after assembly, they are blind.

The holes 146 and 148 do not cross right through the backplane board.

The holes 146 and 148 are coaxial and perpendicular to the plane of the backplane board 20.

The holes 146 and 148 are metallized and give the possibility of establishing an electric connection between the different conductive layers of a same multilayer printed circuit 22. The metallization of the holes consists, once the hole is pierced, of depositing a thin copper layer inside the hole, by a method for depositing copper by electrolysis. Once it is metallized, the hole ensures the electric connection between the layers which it crosses.

The first blind holes 146 are advantageously covered with an external layer 9 of insulating polymer such as the polyimide of the Kapton® type (a polyimide from Dupont de Nemours). This layer is intended to be pierced by pin-shaped connectors 131 during the assembling of the board connectors 13 (FIG. 5b). It gives the possibility of protecting the blind holes 146 from any pollution before assembly of the board connectors 13 and notably from polluting agents which come from the metallization of the through-holes 147.

Metallized Through-Holes

The backplane board 20 has through-holes 147 which cross right through the backplane board 20. The through-holes 147 are metallized and give the possibility of establishing an electric connection between all the conductive layers.

The through-holes 147 are coaxial and perpendicular to the plane of the backplane board 20.

Both conductive layers 211 are connected together with a cylindrical metal layer 129.

Figure 11:
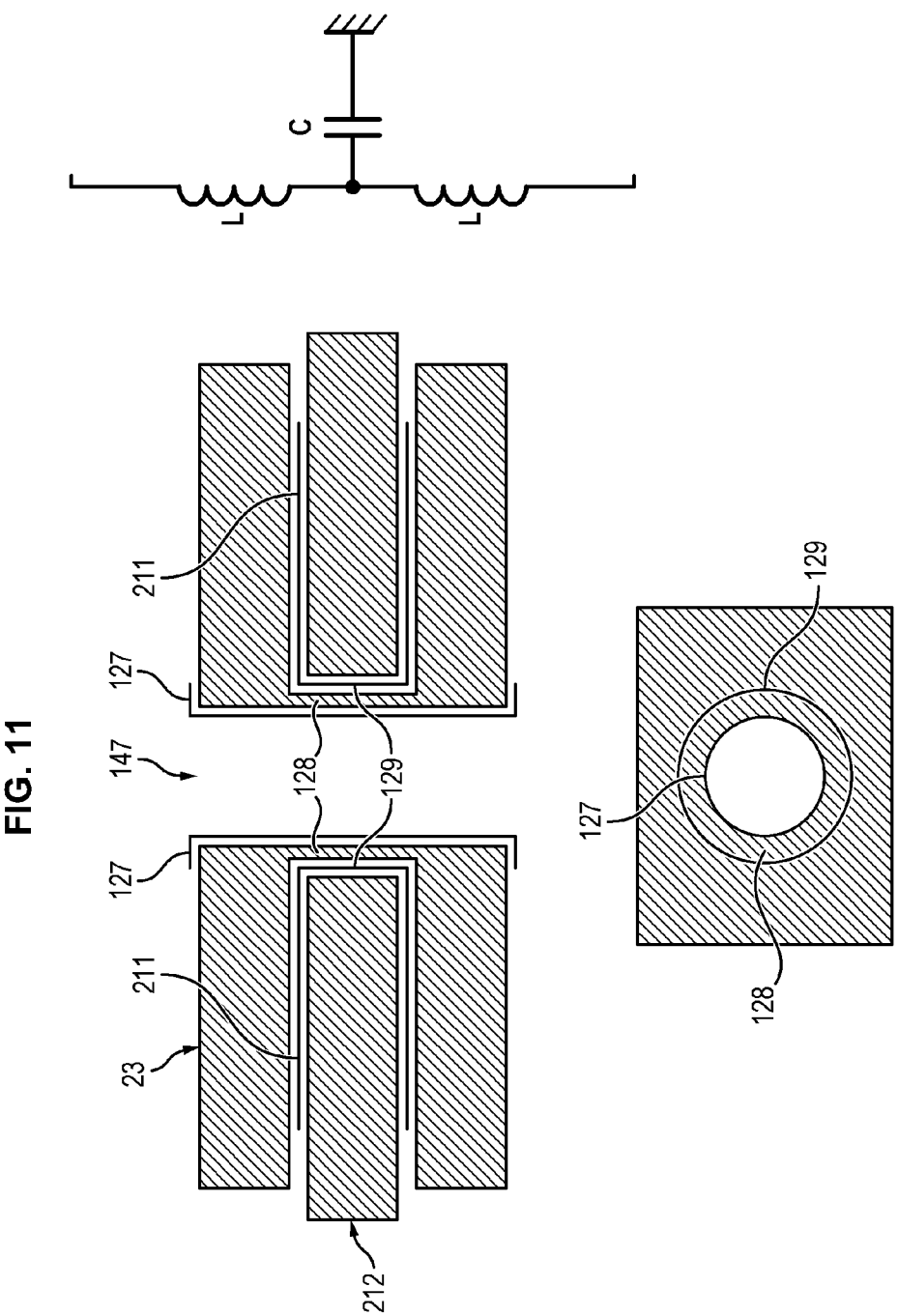
FIG. 11 illustrates the embodiment of two coaxial metallizations forming a capacitor and two inductances and finally, a low-pass filtering network ensuring a function for filtering the electromagnetic noise.

With reference to FIG. 11, the metal wall of the metallized through-hole 147, both conductive layers 211 connected to two equipotentials, and the cylindrical metal layer 129 forming together a low-pass filtering network ensuring a function for filtering the electromagnetic noise. Indeed, the metal wall of the metallized through-hole 147 forms with the conductive layer 129 a capacitance, while the metallization portions of the hole 147 emerge from two conductive layers 211 forming two inductors.

Force-Insertion Connection Elements 131 and 151

The force-insertion connection elements 131 borne by the board connectors 13 and the force-insertion connection elements 151 borne by the external connector 15 are adapted so as to be inserted by force into one of the blind holes 146 of the backplane board 20 so as to form an electric force-insertion junction a so called 'press-fit' junction with the blind hole, ensuring mechanical and electrical interconnection.

Once the force insertion connection element 131 or 151 is inserted into a hole 146 or 148, they form together a connection point.

When a pin-shaped contact element 131 and 151 is driven into a hole 146 or 148, the pin-shaped contact element 131 and 151 and/or the holes 146 and 148 deform elastically during the insertion, so as to cause a friction force between both of them.

For this purpose, the pin-shaped contact elements 131 and 151 have elastic properties in compression. The pins 131 and 151 comprise a pressure-fit portion adapted so as to be put into contact with an internal surface of the holes 146 and 148 of the printed circuit. The pressure fit portion comprises a mechanism with tightened adjustment adapted so as to be elastically deformed during the insertion into the holes 146 and 148. This mechanism with tightened adjustment typically comprises a protrusion and a complementary recess such as for example a boss or a slot with the shape of a 'needle hole' at the center of the longitudinal axis of the pin.

Alternatively or additionally, the holes 146 and 148 have elasticity properties.

The diameter of the holes 146 and 148 is slightly smaller than the width of the pin, so that the insertion generates a friction force.

The holes 146 and 148 typically have a cylindrical shape.

In order to improve the insertion and the maintaining of the pins in the holes 146 and 148, the holes 146 and 148 advantageously have a diameter which decreases in the direction oriented towards the inside of the electronic board at the surface of the electronic board. The holes 146 and 148 for example have a frustoconical shape.

A first leak-proof membrane 102 is positioned between the first printed circuit 222 and the third printed circuit 224.

A second leak-proof membrane 103 is positioned between the second printed circuit 223 and the third printed circuit 224.

By leak-proof, is meant that it does not let through the resin.

The first blind holes 146 open on the one hand on the internal face 142 of the backplane electronic board 20 and on the other hand on the first leak-proof membrane 102.

The second blind holes 148 open on the one hand on the external face 143 of the backplane electronic board 20 and on the other hand on the second leak-proof membrane 103, The leak-proof membranes 102 and 103 give the possibility of suppressing the risk of pollution of the blind holes during the manufacturing by preventing the upward movement of the resin during the assembly of the printed circuits 22, 223 and 224.

The leak-proof membranes 102 and 103 are in a material which is typically in an insulating polymer such as the polyimide of the Kapton® type (a polyimide from Dupont de Nemours).

The leak-proof membranes 102 and 103 are in a material having a hardness greater than or equal to that of Kapton® i.e. a Rockwell hardness greater than or equal to E52-99, the Rockwell hardness being defined as the resistance opposed by a surface of the sample to the penetration of a steel ball with a diameter of 1.588 mm, one Rockwell hardness unit corresponds to a sinking-in of 0.001 mm.

The main printed circuit 28 includes a double face printed circuit 21 positioned in the middle of two insulating layers 23 themselves positioned in the middle of the two multilayer printed circuits 22. The multilayer printed circuits 22 include tracks for routing of signals between the different connection points and define a routing area for the routing of the signals.

Conventionally, the internal area of the computer is called the clean area and the area external to the computer the dirty area since the latter is polluted by any type of external electromagnetic emissions. The presence of a double face printed circuit 21 and of the two insulating layers 23 gives the possibility of improving the isolation between the dirty area and the clean area.

The double face printed circuit 21 includes two conductive layers 211 connected to two equipotentials positioned on either side of a central insulating layer 212 in pre-preg. Both conductive layers 211 connected to two equipotentials positioned on either side of a central insulating layer 212, typically in a pre-preg form for example with a fabric pre-impregnated with resin, form a shielding area 121 efficient for segregating the clean area from the dirty area.

When the backplane board 20 includes a main printed circuit 28 including two multilayer printed circuits 22, two insulating layers 23, and a double face printed circuit 21 positioned in the middle of the two insulating layers 23, themselves positioned in the middle of the two multilayer printed circuits 22, the double face printed circuit 21 forming the shielding area 121, the first membrane 102 is positioned between the multilayer printed circuit 22, and one of the insulating layers 23, and the second membrane 103 is positioned between the multilayer printed circuit 22 and the other insulating layer 23.

The multilayer printed circuits 22 including several conductive layers 221, each separated with insulating layers 222 typically in epoxy resin.

The metallized blind holes 146 cross one of the multilayer printed circuits 22 but not the double face printed circuit 21. The metallized blind holes 146 give the possibility of establishing an electric connection between the different conductive layers of a same multilayer printed circuit 22.

The metallized through-holes 147 cross both multilayer printed circuits 22 and the double face printed circuit 21. The metallized through-holes give the possibility of establishing an electric connection between all the conductive layers.

Interface Platelets 30

In a particular embodiment, for solving the problem of its insufficient thickness for simultaneously receiving in the same printed circuit pins 131 and 135 on either side, the backplane board 20 is thickened artificially by setting interface platelets 30 on the main printed circuit 28 under the connectors to be raised.

An interface platelet 30 may be attached on the external face 143 of the backplane board under an external connector 15, as illustrated in FIG. 7, or on the internal face 142 of the backplane board under a board connector 13, as illustrated in FIG. 6.

With reference to FIG. 5b, when the pin-shaped elements 131 (respectively 151) have a length l1 (respectively l2) of the order of 1.5 mm, the backplane board 20 typically has a thickness e1 of 3 mm, and the interface platelet 30 a thickness e2 of 2 mm, the total thickness e3 of the backplane board 20 therefore being of 5 mm, which corresponds to the upper feasibility limit in a standard mode.

With reference to FIG. 5b, when the pin-shaped elements 131 (respectively 151) have a length l1 (respectively l2) of the order of 3.7 mm, the backplane board 20 typically has a thickness e1 of 5 mm, and the interface platelet 30 a thickness e2 of 4 mm, the total thickness e3 of the backplane board 20 therefore being of 10 mm.

With reference to FIG. 8, the interface platelets 30 include a typically double face printed circuit in which are made holes 148 identical with the blind holes 146 adapted for receiving force-insertion connection elements. These holes 148 may also be through-holes plugged by an insulating film.

With reference to FIG. 8, the interface platelets 30 further include, on the face opposite to one on which open out the holes 148, means for attachment 33 to the main printed circuit 28. These attachment means 33 are for example a Ball Grid Array 33 (or BGA) intended to be welded on the main printed circuit 28 which then has receiving areas of adequate diameter. The mechanical cohesion between the interface platelets 30 and the main printed circuit 28 may further be ensured by adhesive bonding by means of an insulating adhesive layer 34 such as an epoxy adhesive flowing by capillarity (called 'underfill').

With reference to FIG. 8, a closure layer 32 typically in epoxy resin may be advantageously added between the insulating adhesive layer 34 and the main printed circuit 28 for preventing the ascent of the insulating adhesive layer 34 in the through-holes 147.

The thickness of the backplane board 20 is determined by four major constraints:
  the length of the contact pins 131 and 135;
  the thickness of the shielding area 121;
  the need for symmetry relative to the shielding area 121.
  The thickness of the backplane board 20 should be sufficient for allowing the reception of the connector pins 131 and 135 on either side of the backplane board.

Further, the shielding area 121 should be positioned in the middle of the backplane board 20 for ensuring its function of electromagnetic shielding. Thus, the contact pins 131 of the boards should have the same length as those of the external connector 135.

The thickness of the main printed circuit 28 is typically selected so that the space between the connector pins 131 and 135 have a thickness e4 of at least 1 mm.

In the cases where the backplane board 20 includes a single main printed circuit 28, the latter having a thickness e1 of at least 5 mm for allowing the reception in opposition of the board connectors 13 and of the external connector 15.

The main printed circuit 28 may further include functions for filtering the electromagnetic noise.

Electronic components 50 contributing to the maintaining in an electromagnetic environment of the complete computer may also be placed in spaces left free between the external connectors and the mechanical frame 10.

Manufacturing Process

Figure 12:
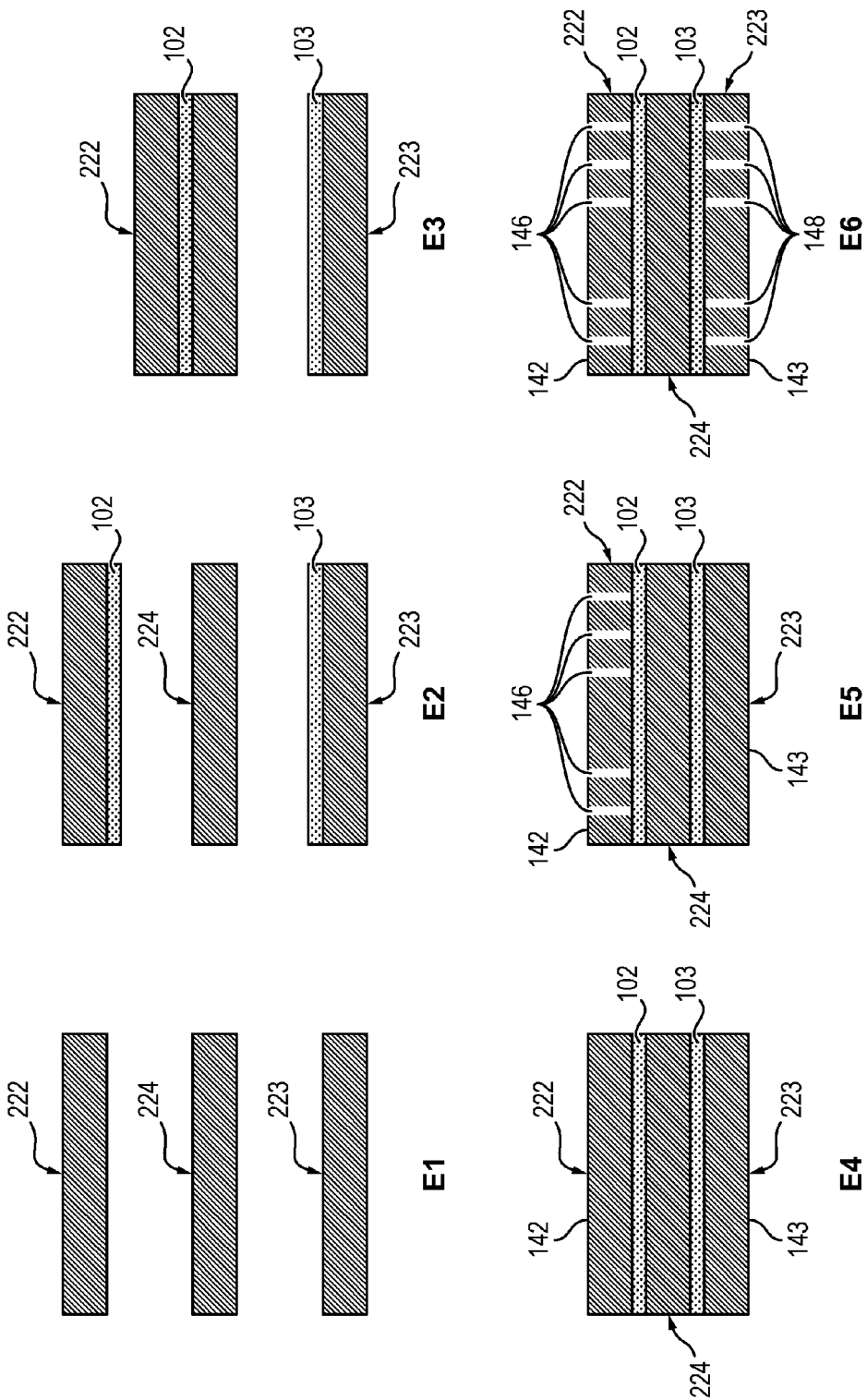
FIG. 12 illustrates the method for manufacturing a backplane electronic board according to the invention.
Figure 13:
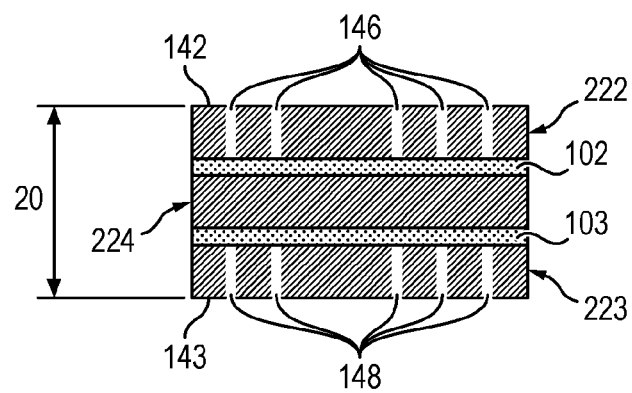
FIG. 13 illustrates an electronic backplane board according to the invention.

With reference to FIG. 12, the backplane electronic board 20 may be manufactured according to a process including the following steps:
  E1 providing a first printed circuit 222 having a first face and a second face intended to form the internal face 142 of the backplane electronic board 20, a second printed circuit 223 having a first face and a second face intended to form the external face 143 of the backplane electronic board 20 and of a third printed circuit 224;
  E2 depositing on a first face of the first printed circuit 222 a film adapted for solidifying and forming a first membrane 102 and depositing on a first face of the second printed circuit 223 a film adapted for solidifying and forming a second membrane 103;
  E3 attachment of the first face of the first printed circuit 222 on one of the faces of the third printed circuit 224;
  E4 attachment of the first face of the second printed circuit 223 on the other face of the third printed circuit 224;
  E5 forming in the first printed circuit 222 a series of first blind holes 146 opening on the one hand on the first face of the first printed circuit 222, and on the other hand on the first leak-proof membrane 102;
  E6 forming in the second printed circuit 223 a series of second blind holes 148 opening on the one hand on the first face of the second printed circuit 223 and on the other hand on the second leak-proof membrane 103, the first and second blind holes 146, 148 being adapted for receiving force-insertion connection elements and forming with them an electric connection point.

Figure 14:
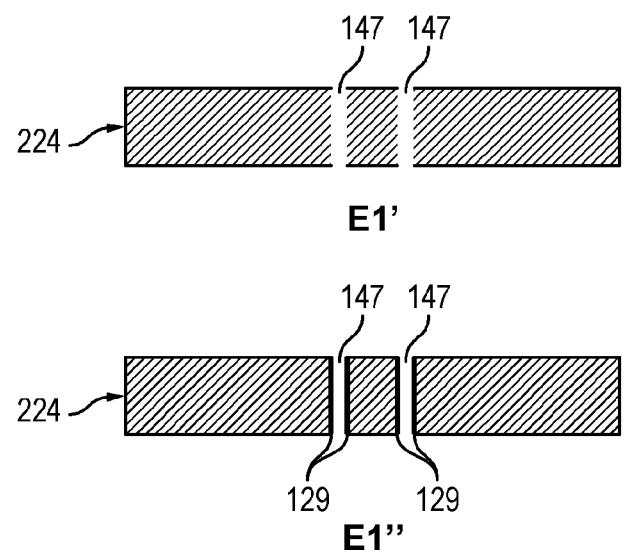

The through-holes 147 are formed in the following way, with reference to FIGS. 14 and 15, before step E2:

E1' forming through-holes in the third printed circuit 224;
E1" depositing a first metallization 129 on the wall of the through-holes 147.

And then, with reference to FIG. 15, after the assembling steps E1 to E6:

A step E7 of piercing all the layers 222, 224 and 223 for forming holes 147, coaxial with the initial metallized holes of the circuit 224, filled with resin during the assembling phase.

During the attachment of the printed circuits 223 and 222 on the printed circuit 224 by means of the resin, an insulating resin layer 128 is deposited on the walls of the through-holes 147.

E8 depositing a second metallization 127 on the wall of the through-holes 147. This last metallization forms a capacitive coupling with the metallization from the junction between the upper and lower 211 layers (FIG. 11) of the double face printed circuit 224.

The electronic computer 1 may notably be manufactured by the following manufacturing method.

In a first step, the interface platelets 30 are welded to the backplane board 20. The interface platelets 30 have through-holes 148. After attachment of the interface platelets 30 on the backplane board 20, the holes 148 are blind.

In a second step, the insulating adhesive layer 34 is added under the interface boards of the external connector 15.

In a third step, the board connectors 13 are mounted by force insertion on the internal face of the backplane board 20.

In a fourth step, the external connector 15 is mounted by force insertion on the external face of the backplane board 20.

In a fifth step, the backplane board 20 is mechanically attached on the mechanical frame 11 of the bottom block.

The invention claimed is:

1. A backplane electronic board comprising:
   an internal face adapted for being connected to connectors of electronic boards and an external face adapted for being connected to an external connector, the backplane board having a first leak-proof membrane, a series of first blind holes opening on the one hand on the internal face of the backplane electronic board and on the other hand on the first leak-proof membrane, and a second leak-proof membrane, a series of second blind holes opening on the one hand on the external face of the backplane electronic board and on the other hand on the second leak-proof membrane, the first and the second blind holes being adapted for receiving force-insertion connection elements and forming with them an electric connection point;
   two conductive layers connected to two equipotentials positioned on either side of a central insulating layer, both conductive layers being connected together with a cylindrical metal layer, and further having metallized through-holes which cross the backplane board on both sides, the metallized through-holes, the cylindrical metal layer, and both conductive layers forming a capacitive through-hole and therefore a low-pass filtering network ensuring a function of filtering the electromagnetic noise;
   a main printed circuit having two multilayer printed circuits, two insulating layers, and a double face printed circuit positioned between the two insulating layers, the two insulating layers positioned between the two multilayer printed circuits, the double face printed circuit forming a shielding area; and
   an interface platelet attached on the main printed circuit, the interface platelet having holes adapted for receiving force-insertion connection elements and forming with them an electric connection point.

2. The backplane electronic board according to claim 1, comprising:
   a first printed circuit having a face intended to form the internal face of the backplane electronic board;
   a second printed circuit having a face intended to form the external face of the backplane electronic board and;
   a third printed circuit;
   the first leakproof membrane being positioned between the first printed circuit and the third printed circuit;
   the second leakproof membrane being positioned between the second printed circuit and the third printed circuit.

3. The backplane board according to claim 1, wherein the first membrane is positioned between the multilayer printed circuit, and one of the insulating layers.

4. The backplane board according to claim 1, wherein the interface platelet comprising a matrix of beads adapted for being welded on the main printed circuit.

5. The backplane board according to claim 1, wherein the first blind holes being advantageously covered with a third leak-proof membrane intended to protect the metallized holes and to be pierced by force-insertion connection elements.

6. The backplane board according to claim 1, wherein the leak-proof membranes are polyimide films.

7. An electronic computer comprising a mechanical frame, the backplane board according to claim 1, one or several electronic board connectors connected to the backplane board on the backplane board's internal face, and at least one external connector connected to the backplane board on its external face.

8. A method for manufacturing a backplane electronic board according to claim 1, comprising the following steps:
   (E1) providing a first printed circuit having a first face and a second face intended to form the internal face of the backplane electronic board, a second printed circuit having a first face and a second face intended to form the external face of the backplane electronic board and a third printed circuit;
   (E2) depositing on the first face of the first printed circuit of a film adapted for solidifying and forming a first membrane; and depositing on the first face of the second printed circuit a film adapted for solidifying and forming a second membrane;
   (E3) attachment of the first face of the first printed circuit on one of the faces of the third printed circuit;
   (E4) attachment of the first face of the second printed circuit on the other face of the third printed circuit;
   (E5) forming in the first printed circuit a series of first blind holes opening on the one hand on the internal face of the backplane electronic board, and on the other hand on the first leak-proof membrane;
   (E6) forming in the second printed circuit a series of second blind holes opening on the one hand on the external face of the backplane electronic board, and on the other hand on the second leak-proof membrane.

9. The manufacturing method according to claim 8, further comprising the following steps:
   before step (E2):
   (E1') forming through-holes in the third printed circuit;

(E1″) depositing a first metallization on the wall of the through-holes;

during steps (E3) and (E4), the first printed circuit is attached onto the third printed circuit and the second printed circuit onto the third printed circuit by insulating resin, the insulating resin forming an insulating layer on the wall of the through-holes;

(E7) forming in the first printed circuit and the second printed circuit through-holes communicating with those formed in the third printed circuit;

(E8) depositing a second metallization on the insulating layer covering the wall of the through-holes.

10. A backplane electronic board comprising:

an internal face adapted for being connected to connectors of electronic boards and an external face adapted for being connected to an external connector, the backplane board having a first leak-proof membrane, a series of first blind holes opening on the one hand on the internal face of the backplane electronic board and on the other hand on the first leak-proof membrane, and a second leak-proof membrane, a series of second blind holes opening on the one hand on the external face of the backplane electronic board and on the other hand on the second leak-proof membrane, the first and the second blind holes being adapted for receiving force-insertion connection elements and forming with them an electric connection point;

two conductive layers connected to two equipotentials positioned on either side of a central insulating layer, both conductive layers being connected together with a cylindrical metal layer, and further having metallized through-holes which cross the backplane board on both sides, the metallized through-holes, the cylindrical metal layer, and both conductive layers forming a capacitive through-hole and therefore a low-pass filtering network ensuring a function of filtering the electromagnetic noise;

a main printed circuit having two multilayer printed circuits, two insulating layers, and a double face printed circuit positioned between the two insulating layers, the two insulating layers positioned between the two multilayer printed circuits, the double face printed circuit forming a shielding area;

the backplane electronic board further comprising:

a first printed circuit having a face intended to form the internal face of the backplane electronic board;

a second printed circuit having a face intended to form the external face of the backplane electronic board and; a third printed circuit;

the first leak-proof membrane being positioned between the first printed circuit and the third printed circuit;

the second leak-proof membrane being positioned between the second printed circuit and the third printed circuit;

wherein the first membrane is positioned between the multilayer printed circuit, and one of the insulating layers; and an interface platelet attached on the main printed circuit, the interface platelet having holes adapted for receiving force-insertion connection elements and forming with them an electric connection point.

* * * * *